US010298001B2

(12) United States Patent
Nowastowski-Stock

(10) Patent No.: US 10,298,001 B2
(45) Date of Patent: May 21, 2019

(54) METHOD FOR THE PRODUCTION OF A WALL LEAD-THROUGH FOR SEVERAL CABLES AS WELL AS ARRANGEMENT

(71) Applicant: CONTA-CLIP Verbindungstechnik GmbH, Hövelhof (DE)

(72) Inventor: Jörg Nowastowski-Stock, Detmold (DE)

(73) Assignee: CONTA-CLIP Verbindungstechnik GmbH, Hövelhof (DE)

( * ) Notice: Subject to any disclaimer, the term of this patent is extended or adjusted under 35 U.S.C. 154(b) by 0 days.

(21) Appl. No.: 15/571,759

(22) PCT Filed: May 6, 2016

(86) PCT No.: PCT/DE2016/100205
§ 371 (c)(1),
(2) Date: Mar. 9, 2018

(87) PCT Pub. No.: WO2016/177364
PCT Pub. Date: Nov. 10, 2016

(65) Prior Publication Data
US 2018/0301883 A1 Oct. 18, 2018

(30) Foreign Application Priority Data
May 5, 2015 (DE) .................... 20 2015 102 280 U

(51) Int. Cl.
*H02G 3/22* (2006.01)
*H02G 1/06* (2006.01)
(52) U.S. Cl.
CPC ................. *H02G 3/22* (2013.01); *H02G 1/06* (2013.01)
(58) Field of Classification Search
CPC .................................. H02G 3/22; H02G 1/06
(Continued)

(56) References Cited

U.S. PATENT DOCUMENTS 2,732,226 A * 1/1956 Brattberg ................. H02G 3/22
248/56
4,419,535 A * 12/1983 O'Hara .................... H02G 3/22
169/48
(Continued)

FOREIGN PATENT DOCUMENTS

DE 3224977 A1 1/1984
DE 29911305 U1 11/1999
(Continued)

OTHER PUBLICATIONS

International Searching Authority, International Search Report issued for International Application No. PCT/DE2016/100205, dated Sep. 29, 2016 (13 pages).

*Primary Examiner* — Andargie M Aychillhum
*Assistant Examiner* — Michael F McAllister
(74) *Attorney, Agent, or Firm* — Eversheds Sutherland (US) LLP

(57) ABSTRACT

The invention relates to an arrangement with a wall lead-through for a plurality of cables, comprising a wall having a wall opening, a housing of a wall lead-through, which is fixed on one side to the wall, such that a housing aperture formed at the housing is arranged opposite the wall lead-through, and a plurality of cables which extend in each case through the wall lead-through and the housing aperture as well as through an associated sealing element which is arranged in a sealing manner in a receiving space of the housing and surrounds the respective cable circumferentially. According to the invention, separate receptacles for in each case one or more sealing elements, in which the sealing elements are arranged, are formed in the receiving space of the housing and with the aid of at least one grid component which, after the housing has been fixed to the wall, is inserted from an opposite side of the wall through the wall (Continued)

lead-through into the receiving space and there into the area of the housing aperture. The invention further comprises a kit for a wall lead-through.

15 Claims, 9 Drawing Sheets

(58) Field of Classification Search
USPC .......................................................... 174/652
See application file for complete search history.

(56) References Cited

U.S. PATENT DOCUMENTS

| | | | | |
|---|---|---|---|---|
| 5,416,271 | A * | 5/1995 | Birmingham | F16L 5/08 |
| | | | | 174/657 |
| 7,806,374 | B1 * | 10/2010 | Ehmann | H02G 3/22 |
| | | | | 174/40 R |
| 8,093,513 | B2 * | 1/2012 | Elm | F16L 5/08 |
| | | | | 174/151 |
| 8,674,240 | B2 * | 3/2014 | Karlsson | F16L 5/08 |
| | | | | 174/652 |
| 8,963,010 | B2 * | 2/2015 | Sprenger | H02G 3/083 |
| | | | | 174/151 |
| 9,190,820 | B2 * | 11/2015 | Nurmi | H02B 1/305 |
| 2005/0115733 | A1 * | 6/2005 | Kreutz | F16L 5/14 |
| | | | | 174/652 |

FOREIGN PATENT DOCUMENTS

| | | | |
|---|---|---|---|
| DE | 10225046 A1 | 4/2003 | |
| DE | 102005002597 B3 | 8/2006 | |
| DE | 102013201149 A1 | 7/2014 | |
| EP | 0271248 | * 11/1987 | ............ F16L 5/02 |
| EP | 271248 | * 11/1987 | |
| EP | 1710882 A2 | 10/2006 | |
| WO | 2010/011151 A2 | 1/2010 | |

* cited by examiner

METHOD FOR THE PRODUCTION OF A WALL LEAD-THROUGH FOR SEVERAL CABLES AS WELL AS ARRANGEMENT

CROSS REFERENCE TO RELATED APPLICATIONS

This application is a U.S. national stage application of PCT/DE2016/100205, filed May 6, 2016, which claims priority to German Application No. 202015102280.8, filed May 5, 2015. The contents of these applications are hereby incorporated by reference.

The invention relates to a method for the production of a wall lead-through for several cables and an arrangement.

BACKGROUND

Wall lead-throughs for cables, which can also be called cable lead-throughs, serve to guide cables through a wall from one side to the other side. Such wall lead-throughs are particularly used in connection with guiding cables through a housing wall of a unit or a cabinet, for example a control cabinet. Such wall lead-throughs can provide for a seal, for example for sealing against the penetration of moisture and dirt.

Wall lead-throughs can have a housing made of plastic, which is manufactured as an injection moulded part. In the case of this or other known designs, the housing has a housing breakthrough that is located opposite to a wall breakthrough, which the cables are to be guided through.

From document DE 32 24 977 A1, a cable support sleeve held by a notch in a wall for the sealed bushing of a cable or cable set through a wall in motor vehicles is known. The cable support sleeve has a perforated base body with an integrally connected, truncated conical extension whose end collar is supported in a sealing manner on the cable. The base body is quadrilateral, for example square, as a rule. The cable support sleeve has outer narrow surfaces whose regions allocated to the notch are held via tongue and groove connections. The notch holds a plurality of such cable support sleeves whose mutually adjacent narrow surfaces likewise engage in one another via tongue and groove connections. Thus, for example in the region of two mutually approximately parallel outer boundary edges and in a third boundary edge which connects the aforesaid two and is approximately at right angles thereto, the base body in each case has grooves which are recessed into the narrow surface there. In the region of the fourth boundary edge, the base body supports an outwardly projecting tongue which can engage into a groove of an adjacent cable support sleeve when a plurality of cable support sleeves are joined to one another.

Document DE 102 25 046 A1 concerns a device for attaching a cable lead-through to a wall aperture. The device surrounds the aperture on all sides and can be connected to the wall in a tightly sealed and stationary manner. The device has at least one continuous opening for cables and can be connected to the cable lead-through in a stationary and tightly sealed manner. At least one retaining clip is provided in order to be able to detachably connect the cable lead-through to the device.

In the document DE 10 2013 201 149 A1, a cable guide device is disclosed that has a seal carrier that is provided with a cable entry opening for the arrangement of a cable gasket. The seal carrier and the cable gasket comprise a separation plane extending parallel to a cable guide direction, wherein a threaded element is provided that can be screwed against the seal carrier for abutment of the cable gasket against the cable arranged in the cable lead-through opening.

From the document DE 299 11 305 U1, a cable-plug lead-through system for housings for accommodating electrical and/or electronic components is known. The lead-through system is provided with a multi-part grid component with receiving means for sealing elements which is to be mounted on one side of the housing breakthrough.

A multi-part housing for a wall cable lead-through is further known from the document U.S. Pat. No. 7,806,374 B1.

In the document DE 102 25 046 A1, a device for attaching a cable lead-through to a wall aperture is disclosed. A multi-part grid component is arranged on the backside of a housing that is to be mounted on the wall.

A cable lead-through and a cable lead-through system are further described in the document EP 1 710 882 A1.

From the document WO 2010/011151 A2, a wall duct for a connector pipe is known. When manufacturing the wall duct, a cubicoidal part of a thermal insulator is entered through a hole in the wall and thereby also through a hole in a fastening plate which is arranged on the inner side of the wall with the hole. Thereby, the cubicoidal part of the thermal insulator is entered into the inside of a solar collector. Into this arrangement, a connector pipe is then entered to provide a pipe connection on the outside and the inside, respectively. A mounting ring is arranged on the connector pipe.

SUMMARY

The object of the invention is to provide an improved arrangement with a wall lead-through for a plurality of cables and a method for the production as well as an assembly kit that make it possible to adapt to various application situations. Particularly, the lead-through of pre-assembled cables, in which the cable ends are usually fitted with components such as connector aids or plugs, through a wall should be supported In order to solve this, a method for the production of a wall lead-through for a plurality of cables according to independent claim 1 is provided. Further, an arrangement for a wall lead-through according to claim 15 is provided. Further embodiments are the subject of dependent claims.

According to one aspect, an arrangement with a wall lead-through for a plurality of cables is provided. The arrangement has a wall with a wall breakthrough, through which a plurality of cables are guided. The wall can be made of various materials, for example plastic or metal. In one embodiment, it can be a wall made of sheet metal. The wall lead-through comprises a housing that is arranged on one side of the wall in such a way that a housing breakthrough formed on the housing is located opposite to the wall breakthrough. A plurality of cables each run through the wall breakthrough and the housing breakthrough as well as an assigned sealing element. The respectively assigned sealing elements are arranged within a holding space of the housing around the respective cable in a sealing manner. In the holding space of the housing of the wall lead-through, receiving means separated with the aid of at least one grid component are formed, for one or a plurality of sealing elements each, in which the sealing elements accommodating and sealing the cables are arranged. The grid component is inserted, after arranging the housing on the wall, from an opposite side of the wall, which can be, for example, an inner side, through the wall breakthrough, into the holding space and, there, into the area of the housing breakthrough.

According to a further aspect, a method for the production of a wall lead-through for a plurality of cables is provided, wherein the method comprises the following steps: providing a wall with a wall breakthrough; arranging a housing of a wall lead-through on one side of the wall in such a way that a housing breakthrough formed on the housing is located opposite to the wall breakthrough; arranging at least one grid component within a holding space of the housing, wherein the at least one grid component is inserted, after the arranging the housing on the wall, from an opposite side of the wall through the wall breakthrough into the holding space and, there, into the area of the housing breakthrough, and provides therein separated receiving means, for one or a plurality of sealing elements each; and arranging a plurality of sealing elements in the separated receiving means, wherein a plurality of cables are provided that each run through the wall breakthrough and the housing breakthrough as well as an assigned sealing element, which is arranged around the respective cable in a sealing manner in the assigned receiving means.

Fastening of the housing of the wall duct to the wall with the wall breakthrough can take place using one or a plurality of screws, for example. Alternatively or in addition, a snap-on mount, for example, can be provided to for fastening.

The grid or grate component can, for example, be fastened by means of clamping and/or snap-on mount within the holding space of the housing.

The sealing elements can be formed with one or a plurality of cable support sleeves. They can be made of an elastic material, which elastically gives way upon pressure being exerted on it, for example a rubber material. The sealing element can be constructed as a single piece or in several parts. In the case of a one-piece design, a slit or cut extending form the outer edge to a cable lead-through can be provided, which makes opening the sealing element possible, for example to insert a cable from the side along the slit. The sealing elements can, at least in part, be designed as a hollow body with an inner and/or an outer hollow space or as a solid body.

The housing of the wall lead-through can be designed as one-piece or in multiple pieces.

The grid component can be designed as a component with a grate (grate component) that is formed by bars which grip around the respective receiving means in part or in their entirety. A part of the bars can be designed to be discontinuous.

Exactly one sealing element can be arranged in at least one part of the separated receiving means. Exactly only one sealing element can be arranged in all the receiving means. The respective sealing element can accommodate one or a plurality of cables in a sealing manner. In one embodiment, in each receiving means, there is exactly one sealing element that accommodates exactly one cable.

A plurality of sealing elements can be arranged in at least one part of the separated receiving means. The plurality of sealing elements can completely fill the receiving means, in which they are arranged together.

The sealing elements can be designed to automatically clamp the cable and encompass it in a sealing manner when inserted into the receiving means. Hereby, the sealing elements can be subject to pressure in at least one mounting position, in which they are arranged in the assigned receiving means substantially in their entirety, whether it be by the grid component and/or the housing of the wall lead-trough.

In this or other embodiments, the encompassing seal of the cable on the sealing element can be designed using a sealing lip that is arranged on the outer surface of the cable in a discontinuous or a continuous manner in an assembled state.

The automatic clamping and sealing effect can increase the further the sealing element is inserted into the receiving means. The automatic clamping and sealing effect can be designed to continuously increase as a section is inserted into the assembly position.

The sealing elements can be detachably accommodated in the receiving means. Detachable accommodation can, for example be achieved by the sealing elements being pushed into or inserted into the assigned receiving means. The detachable accommodation can enable repeated assembly and disassembly of the sealing elements in the receiving means.

The sealing elements and/or the receiving means can be conical. For example, the sealing elements and/or the receiving means can have a truncated-cone shape. In connection with the grid component, it can be provided that the bars surrounding the receiving means are designed to be conical in cross section. The inclination relative to the midline of the conical gradient for the sealing elements on the one hand and the receiving means on the other hand can be different.

An outer surface of the sealing elements and/or an inner surface of the receiving means can have a surface structuring. The surface structuring can be designed to increase the friction between the outer surface of the sealing element and the inner surface of the receiving means. Complementary surface texturing can be provided on surface sections of the outer surface of the sealing element and the inner surface of the receiving means opposite to each other in the mounting position of the sealing elements.

The sealing elements can have an edge sealing lip arranged on a proximal and/or a distal front surface that is arranged at least in sections on a front surface of the grid component. Therein, the edge sealing lip overlaps, at least in sections, with a front surface of the grid component. In an embodiment, in which the cover is provided on the opposite side of the wall, the cover can press the edge sealing lip against the front surface, whereby an additional sealing effect may be achieved.

The front surface of the grid component can be exposed at least in sections. The front surface of the grid component can thus be visible from one or both sides of the wall in which the wall breakthrough is formed, when the wall lead-through is mounted.

The grid component can be detachably arranged within the housing. A detachable connection can, for example, be provided as a snap-lock connection or a clamp connection. As an alternative to the detachable connection, a connection of the grid component can be provided that is not detachable after it has been inserted into the housing, particularly a connection that can only be separated again by partially destroying the components involved.

An edge encompassing the housing breakthrough can lie on the front surface of sealing elements adjacent to the edge at least in sections. For example, an edge of the housing that extends toward the inside or protrudes can lie on the front surface of sealing elements located at the edge that are arranged within the housing of the wall lead-through.

The grid component can designed as a single piece. As an alternative, the grid component can comprise multiple pieces, for example a plurality of grate elements that can be inserted individually into the holding space of the housing in order to be optionally connected to one another, for example by means of a snap-on or a plug connection. As an alternative, it can be provided that the plurality of grid elements are not connected but are only mounted to the housing of the wall lead-through in its holding space by means of a respective connection. In particular, this does not rule out that surfaces of the plurality of grid components support one another or lay against one another.

A cover can be arranged on the opposite side of the wall. Using the cover, for example a cover plate which is designed as a single piece or in multiple pieces, pressure can additionally be exerted on the sealing elements in order to generate an additional sealing effect. In this or other embodiments, the wall head-through, particularly with regard to the cable seal, can comply with protection class IP65 in accordance with EN 60529. Regardless of meeting the standard, the seal can provide at least moisture and dirt protection in the various embodiments. The cover, for example on the side of the wall facing an interior space, covers the wall breakthrough in part or entirely, whereby the cables run through one or a plurality of openings in the cover plate. The cover plate can be attached by means of one or a plurality of screws.

With regard to the grid or grate component, sealing sections can be provided in distal corner areas of the bars, attaching to them on one or two sides, by means of which sealings are formed between the housing and the grid component when the grid component is mounted within the holding space of the housing. The sealing sections can be formed as a single piece with the grid component. The sealing sections can be made of a softer plastic material in comparison to the bars. The grid component can be manufactured by means of two-component injection molding. When inserting the grid component in the housing, the distal corner areas can move ahead and the sealing sections can ultimately sealingly lie against the interior of the housing when the grid or grate component is attached within the housing by means of snap-on elements that may be arranged adjacent to proximal corner areas on an outer side of the bars. Sealing elements can be pressed against the housing on the inside at least in a snapped-on position with one or both sealing part sections of the sealing section. Both sealing part sections can be connected to one another over a corner. One or a plurality of sealing lips can be arranged on the sealing part section. As an alternative, only a single sealing lip can be provided. In addition, the further sealing part section can have one or a plurality of sealing lips or be free of such.

The sealing lips can be arranged in alignment with other sealing lips on the sealing elements when the sealing elements are seated within the receiving means. Herein, a form-locking fit can be provided. The sealing lips and the further sealing lips can be provided with the same constructional height. As an alternative or in addition, the sealing lips can have an identical cross section as the further sealing lips. Connections between the sealing sections extending into the corner areas in the area of a front side of the bars may be provided, which may alternatively not be present. The connections, which may be designed to be narrower than the sealing sections, can extend, at least in part, into recesses within the bars which are formed with conduits. In addition or as an alternative, such an embodiment can be provided with regard to the sealing sections. Side sections of the sealing sections can connect to the sealing elements by means of an interlocking fit. A surface of the further sealing part section can lie on a plane with a surface of the sealing elements. Collar sections may be formed on one or both sides of the further sealing part section.

In connection with the assembly kit for the wall lead-through as well as the method for production, the aforementioned embodiments can be provided accordingly.

DESCRIPTION OF EXEMPLARY EMBODIMENTS

In the following, further exemplary embodiments will be explained in further detail with regard to figures of a drawing. In the figures show:

FIG. 1 a schematic illustration of an arrangement with a wall section and a wall lead-through for a plurality of cables;

FIG. 2 a schematic illustration of a further arrangement with a wall section and a wall lead-through for a plurality of cables;

FIG. 3 a sectional view of the arrangement of from FIG. 1;

FIG. 4 a schematic illustration of components of the arrangement of FIG. 1;

FIG. 5 a schematic cross-section illustration of a section of the arrangement with the wall lead-through;

FIG. 6 a schematic cross-section illustration of a further section of the wall lead-through for a plurality of cables;

FIG. 7 a perspective illustration with a housing and a grid component for a wall head-through accommodated therein;

FIG. 8 a schematic perspective illustration of a grid component on which sealing sections are formed; and FIG. 9 a schematic perspective illustration of the grid component from FIG. 8, wherein sealing elements are arranged within receiving means.

In the following, with regard to FIGS. 1 to 7, embodiments of a wall head-trough 1 for leading a plurality of cables 2 through a wall 3, for which a wall section is shown, in a sealed manner are described. The wall 3 may be, for example, a housing wall of a unit or a control cabinet. The wall 3 can, for example, be made of a sheet-metal material.

FIG. 1 shows a perspective illustration of an arrangement with the wall head-trough 1 which has a housing 4, manufactured as a single piece from a plastic material in the embodiment shown, for example as an injection moulded part. The housing 4 is attached to a side 5 of the wall 3, for example by means of screws 6. The housing 4 is set onto the wall 3 and provides a holding space 7 its interior (cf. FIGS. 4 and 7 below in particular). A grid component 8 is arranged within the holding space 7. The grid component 8 provides a plurality of receiving means 9 in the embodiment shown, in each of which a sealing element 10 with one or a plurality of cables 2 is arranged. The sealing element 10 seals the respective cable all around, particularly against moisture and dirt entering.

FIG. 2 shows a perspective illustration of a further arrangement with another embodiment of the wall lead-through 1. The grid component 8 provides a different division or separation of the receiving means 9 within the holding space 7 of the housing 4.

Figure 1:
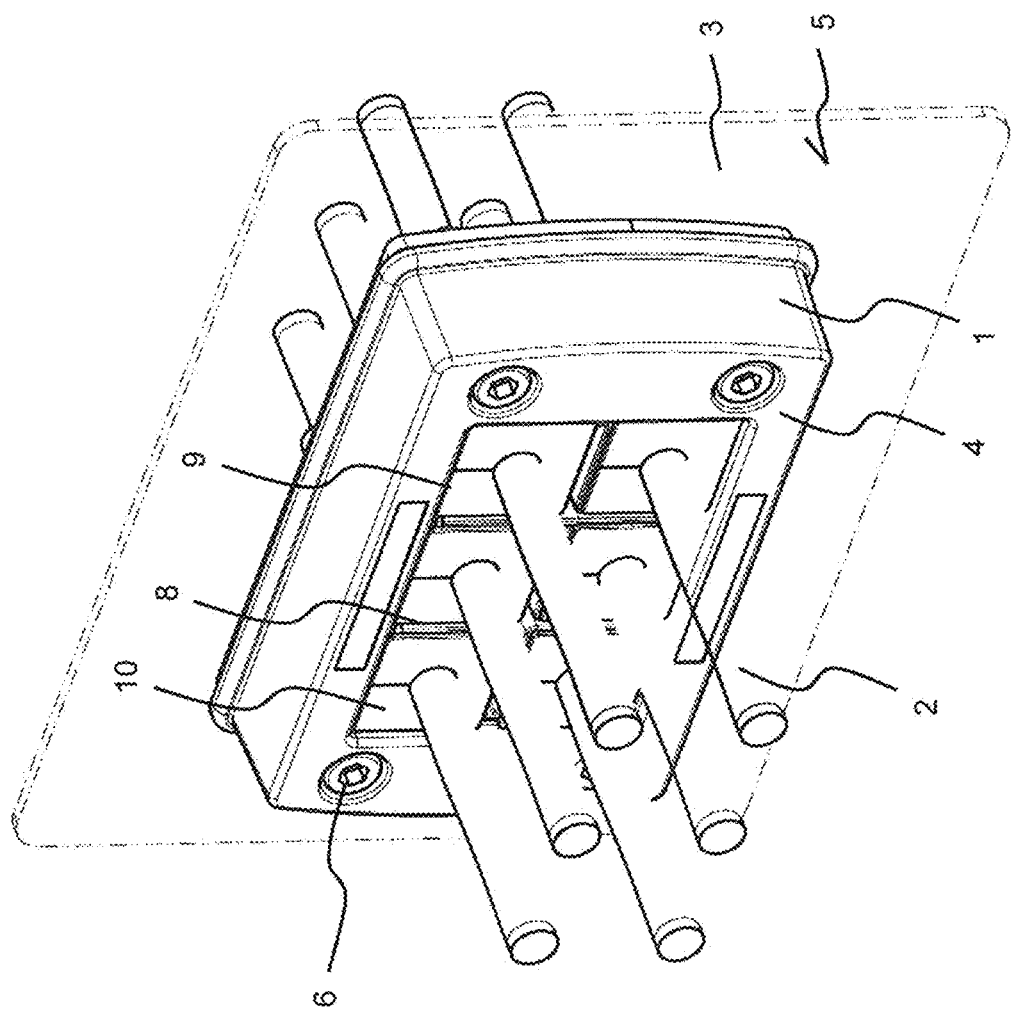
Figure 2:
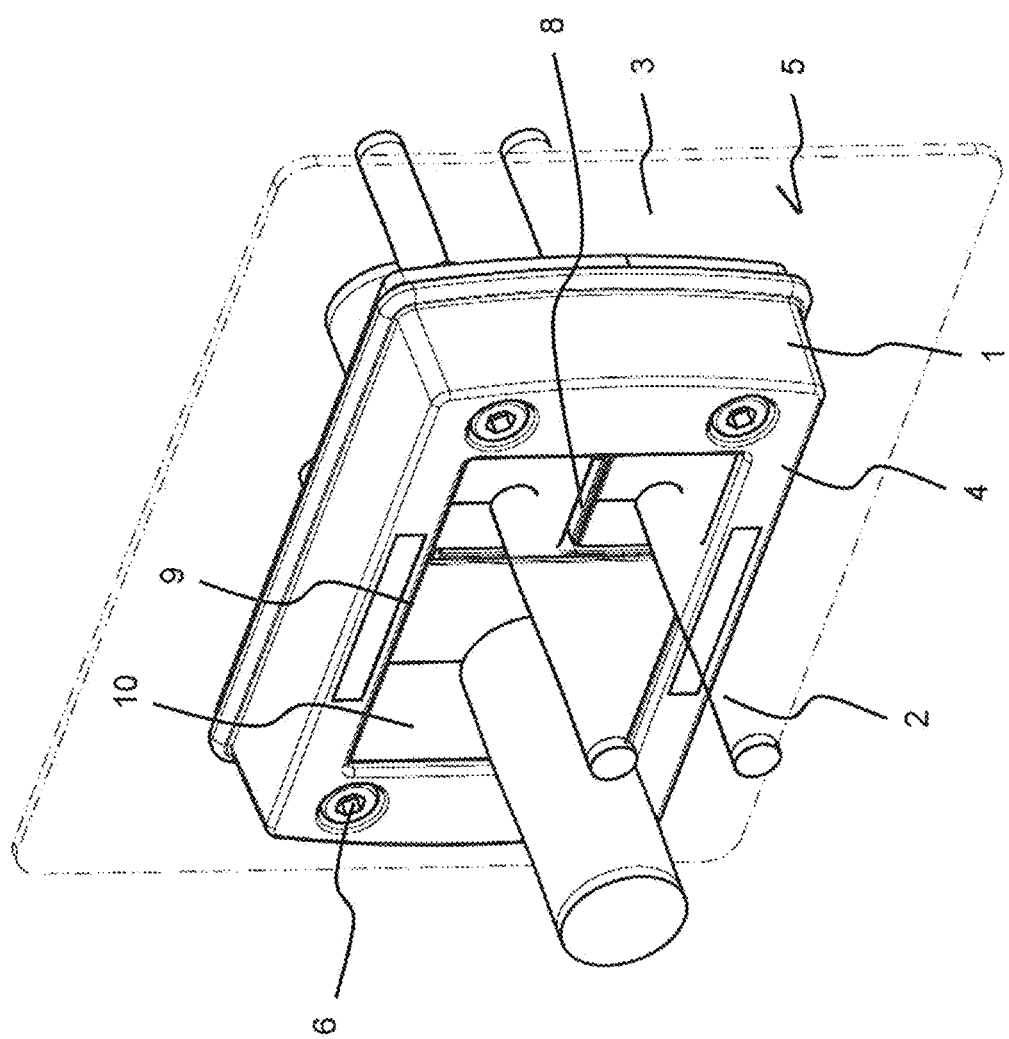
Figure 3:
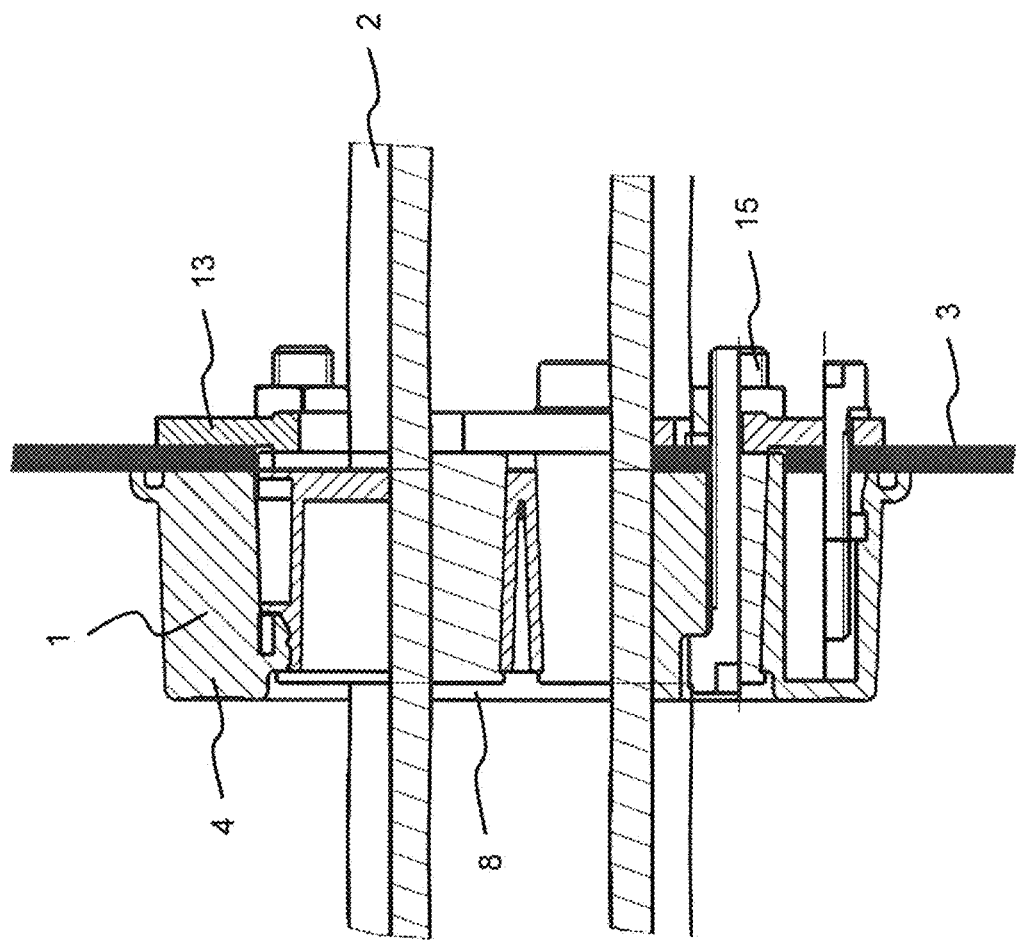
FIG. 3 shows a cross-sectional view of the arrangement in FIG. 1.
Figure 4:
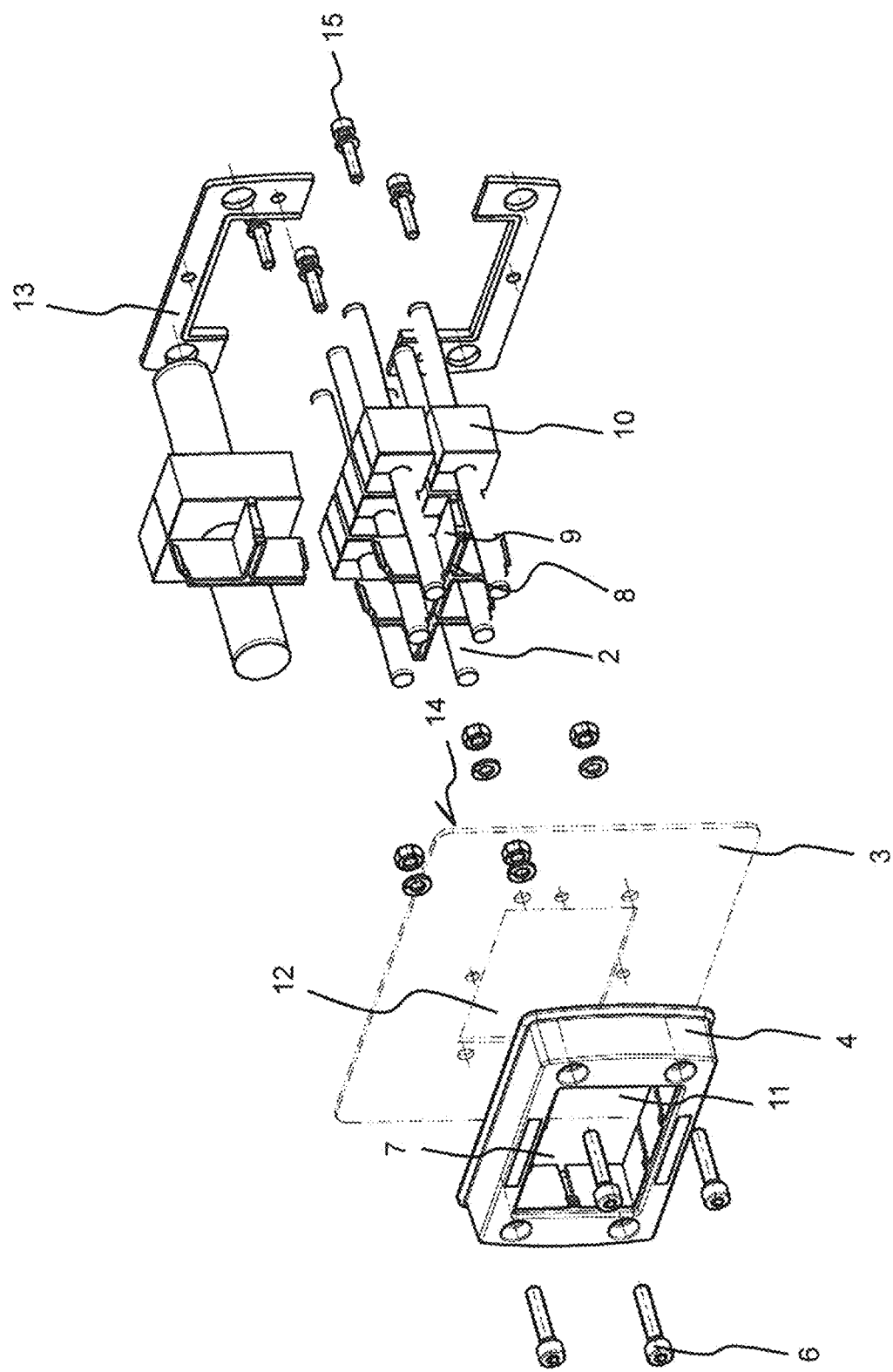
FIG. 4 shows an exploded view of the arrangement with the embodiment of the wall lead-through 1 according to FIG. 1.

In particular from FIG. 4, it can be seen that the grid component 8 can be inserted into the holding space 7 of the housing 4 after the housing 4 is attached to the side 5 of the wall 3 by means of screws 6. With the help of mounting the housing 4, a housing breakthrough 11 is arranged opposite to a wall breakthrough 12 so that both breakthroughs planarly overlap at least partially. The grid component 8 can be inserted into the holding space 7 through the wall breakthrough 12 in order to provide the receiving means 9, into which the sealing elements 10 with the respective cable are inserted. In the embodiment shown, a cover 13 is provided on an opposite side 14 of the wall 3 that is also attached to the wall 3 by means of screws 15.

It is thereby possible, while assembling the wall leadthrough, to initially mount the housing 4 to the side 5 of the wall 3 in order to then insert fitted cable ends of the plurality of cables 2 through the still extensive opening of the wall breakthrough 12 and the housing breakthrough 11. Following, the grid component 8 can be mounted through the wall breakthrough 12 in the holding space 7 in order to ultimately insert the sealing elements 10 into the receiving means 9.

Figure 6:
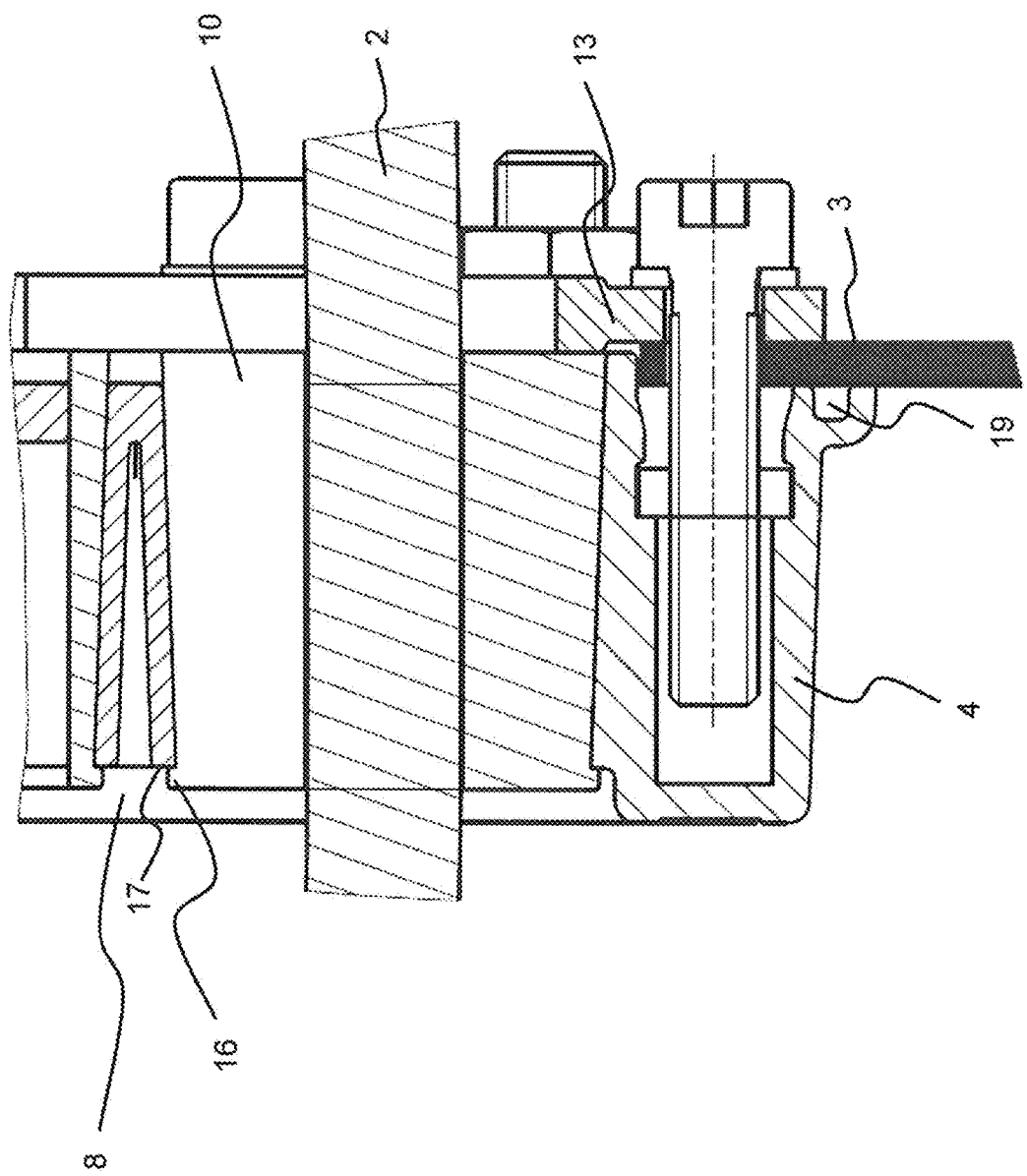

In the embodiment shown, the sealing elements 10 clamp automatically in the receiving means 9 when the sealing elements 10 are inserted. In addition, the receiving means 9 are conical, which is shown in FIG. 6 particularly. In addition or as an alternative, the sealing elements 10 can have a conical outer shape. It is furthermore shown in FIG. 6 that an edge sealing lip 16 that lies on a front surface 17 of the grid component 8 is formed on the sealing elements 10.

Figure 5:
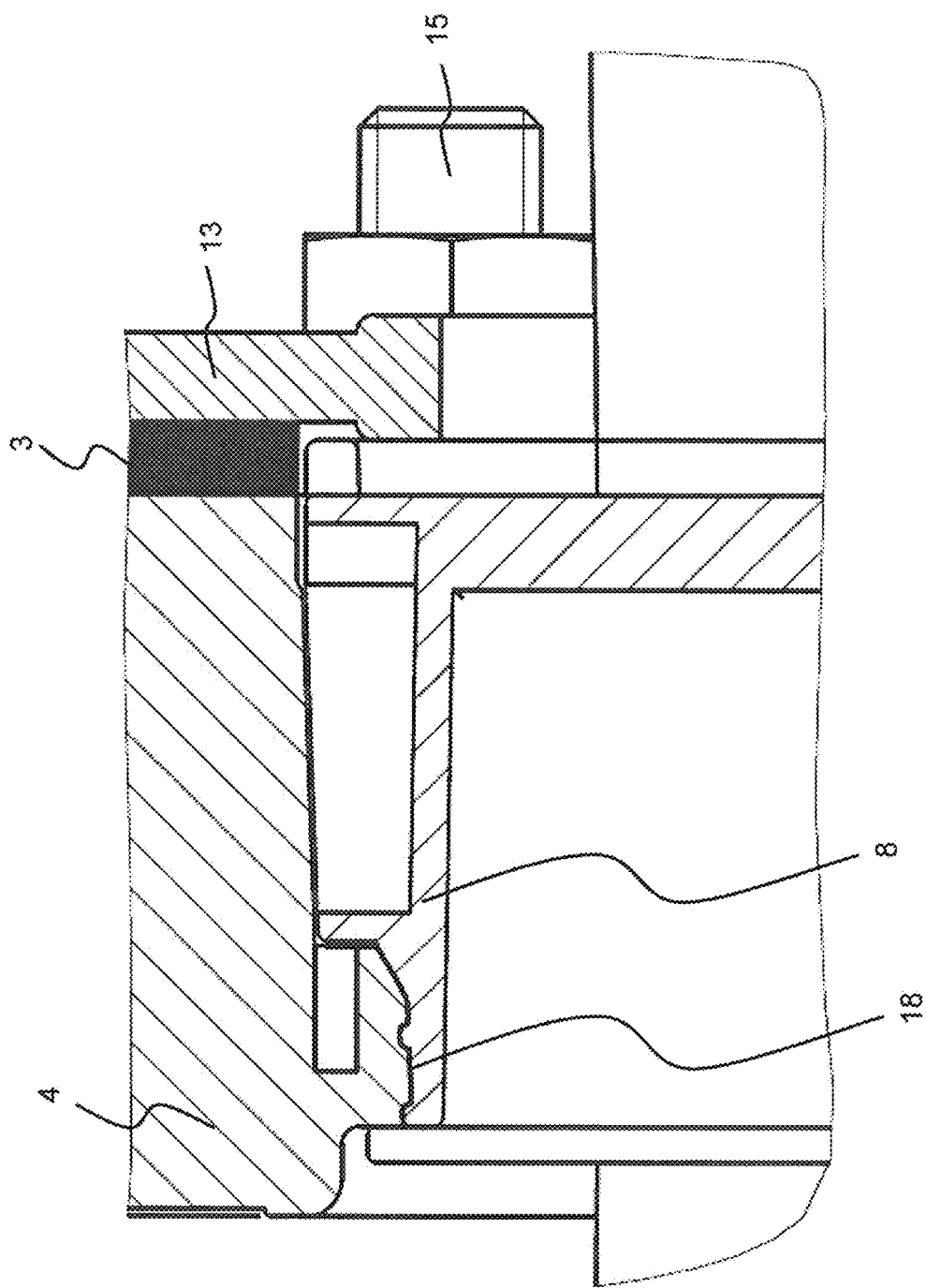

FIG. 5 shows a schematic cross-section illustration of a section of the arrangement with the wall head-through 1. In particular, it is shown that the grid component 8, which is formed as an insertion frame in the embodiment shown, is mounted to the housing 4 by means of a snap-on connection 18.

Figure 7:
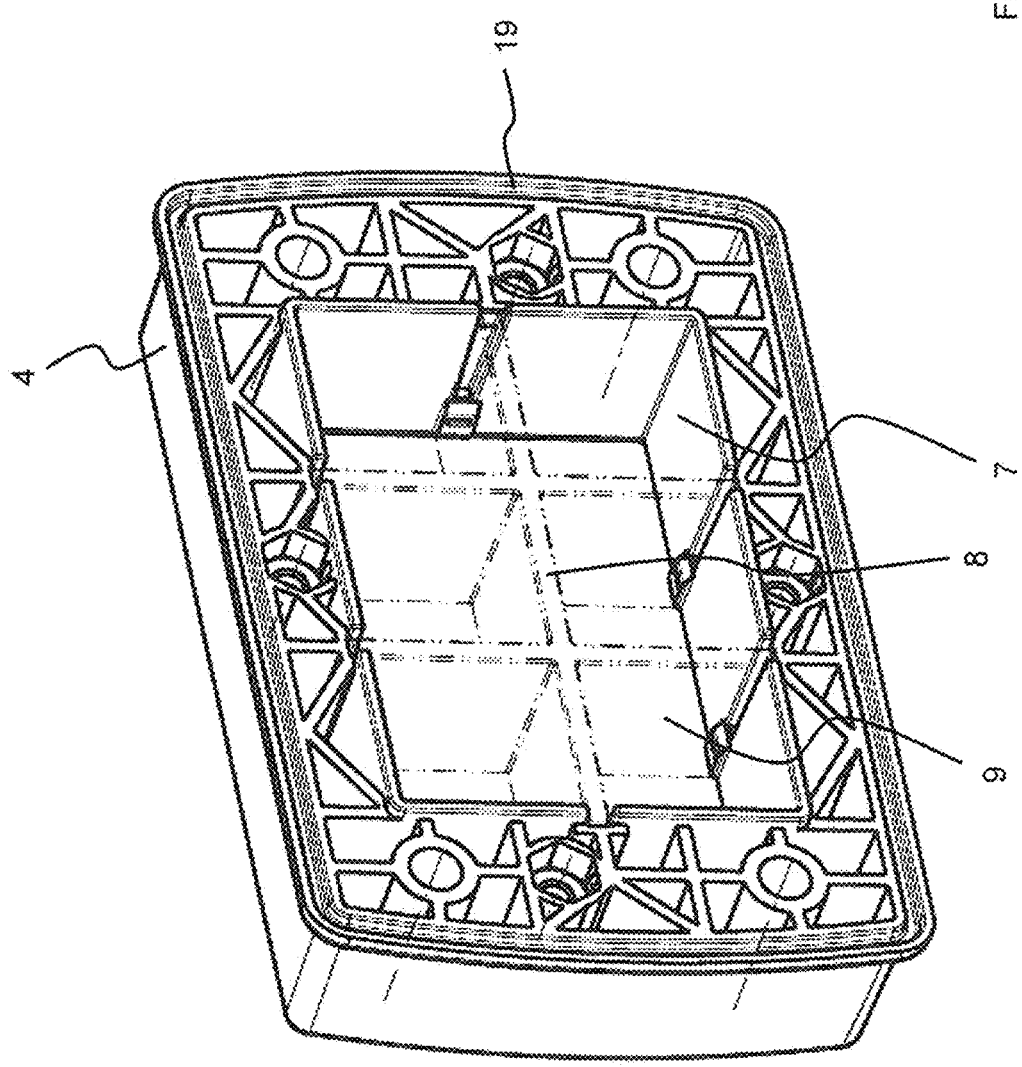

FIG. 7 shows a perspective illustration in which the grid component 8 is inserted into the housing 4. All around, a sealing lip 19 is provided on the housing 4.

Figure 8:
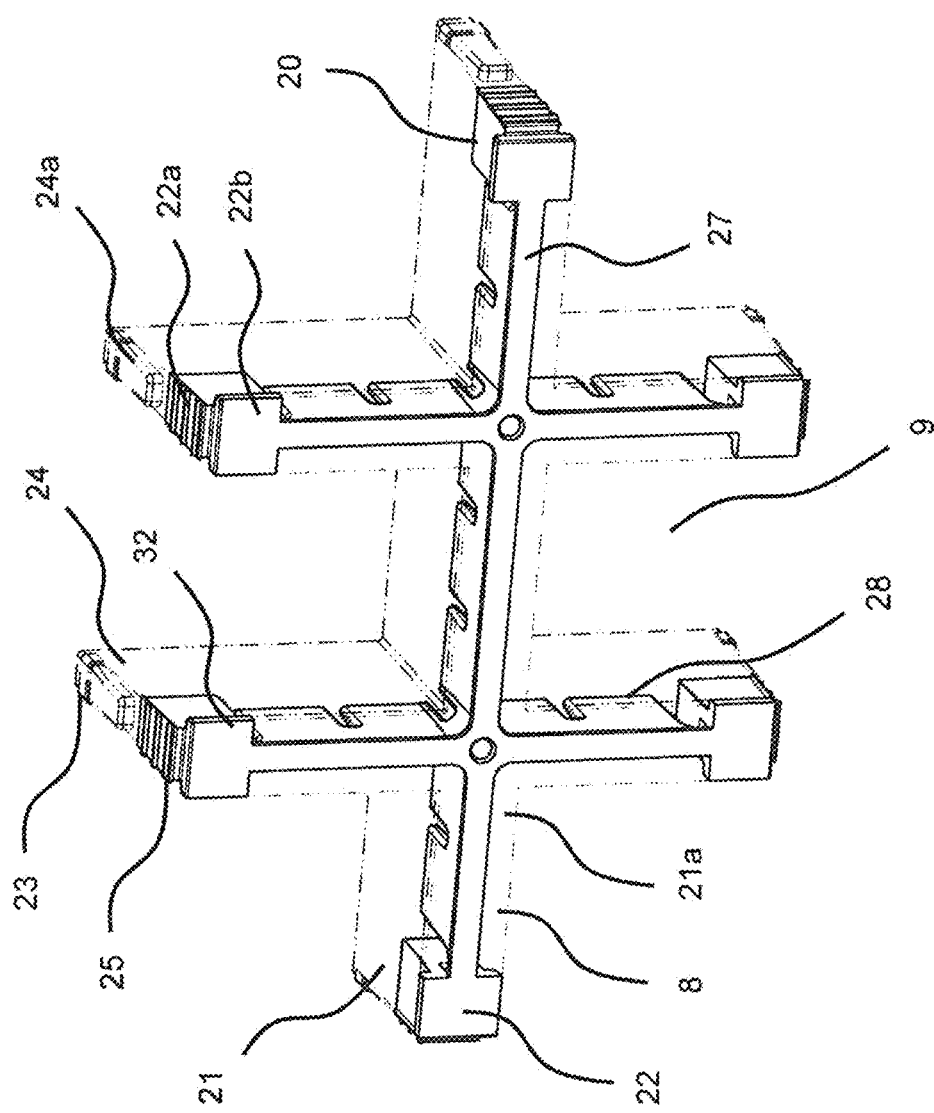
Figure 9:
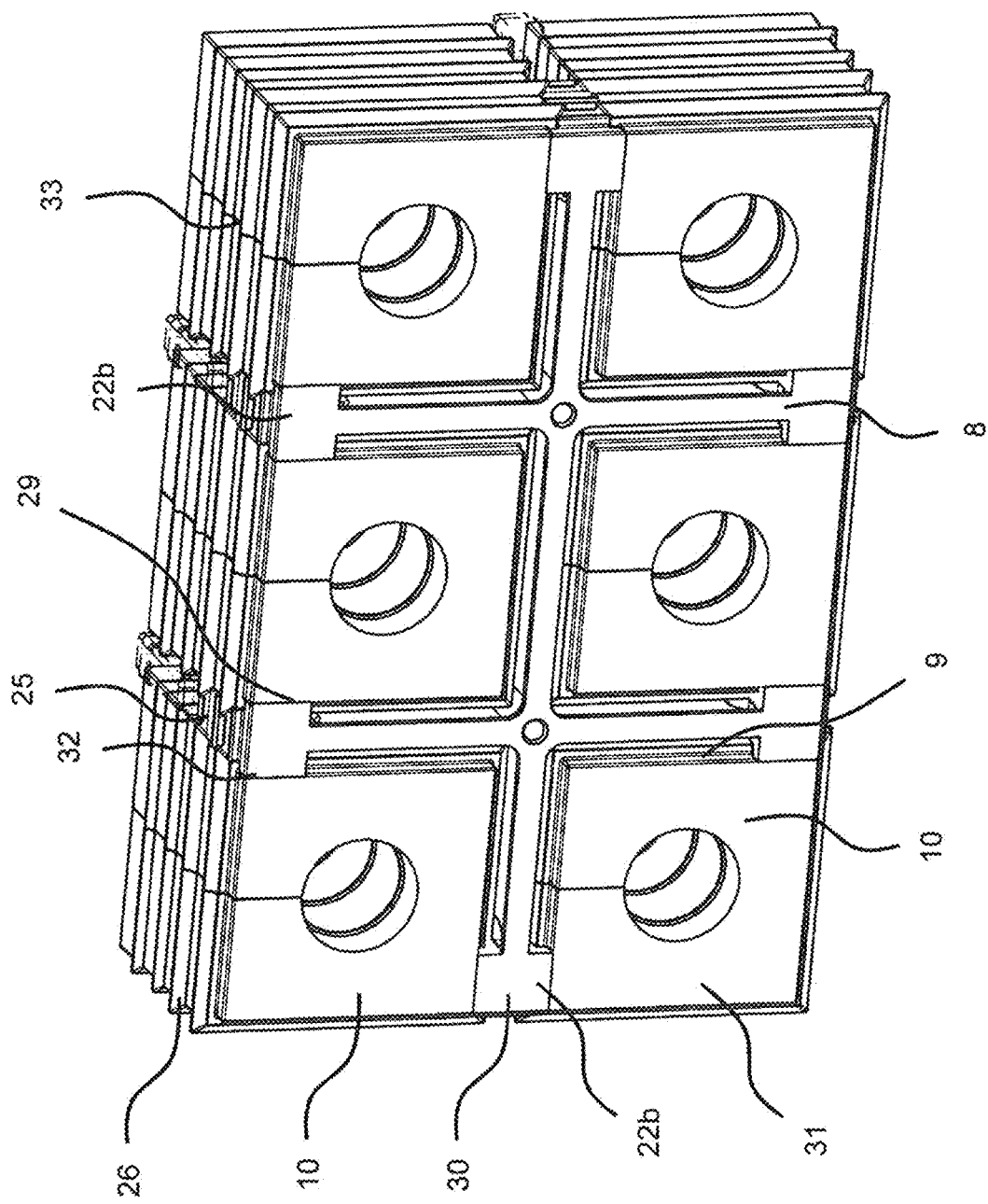

FIGS. 8 and 9 show schematic perspective illustrations of a further embodiment for the grid component 8. In FIG. 9, sealing elements 10 are arranged in the receiving means 9.

In distal corner areas 20 of the bars 21 of the grid component 8, sealing sections 22 are formed. The sealing sections 22 are made from a softer plastic material in comparison to the bars 21, for example from a plastic material that elastically gives when subjected to pressure. The grid component 18 may be manufactured by means of two-component injection molding.

When inserting the grid component into the housing 4, the distal corner areas 20 move ahead and the sealing sections 22 ultimately sealingly lie partly or completely against the interior of the housing 4 when the grid or grate component 8 is attached within the housing 4 and/or on the wall breakthrough by means of snap-on elements 23 that are arranged adjacent to proximal corner areas 24 on an outer side of the bars 24a. Herein, the sealing sections 22 can be pressed against the inside of the housing 4 at least in an inserted position with one or both sealing part sections 22a, 22b of the sealing section 22. Sealing lips 25 are arranged on the sealing part section 22a. As an alternative, only a single sealing lip can be provided. The other sealing section 22b, which can be omitted in an alternative embodiment, can additionally comprise one or a plurality of sealing lips (not shown) or be free of such (cf. FIG. 8).

According to the illustration in FIG. 9, the sealing lips 15 can be arranged in alignment with further sealing lips 26 on the sealing elements 10 when the sealing elements 10 are seated within the receiving means 9. Herein, a form-locking fit can be provided. The sealing lips 25 and the further sealing lips 26 can have the same constructional height. As an alternative or in addition, the sealing lips 25 and the other sealing lips 26 can have an identical cross section.

As shown in FIGS. 8 and 9 as an example, connections 27 between the sealing sections 22 extending into the corner areas 20 may be provided within the area of a front side 21a of the bars 21, which may alternatively not be present. In the embodiment shown, the connections 27 extend into the recesses 28 in the bars 21, that may be formed with conduits in such a way that the material the connections 27 are made of can reach into the recesses 28 from the front side 21a.

In accordance with FIG. 9, in the embodiment shown, side sections 29 of the sealing sections 22 connect to the sealing elements 10 in a form-locking manner. A surface 30 of the further sealing part section 22b can lie on a plane with a surface 31 of the sealing elements 10, as shown in FIG. 9. Side collar sections 32 are formed on the side of the other sealing part section 22b.

The sealing elements 10 comprise a section 33 that enables the opening, expansion or the spreading of the sealing elements 10, for example when inserting a cable.

The features disclosed in the specification above, the claims as well as the drawing can be of significance both individually as well as in any combination for the implementation of the various embodiments.

The invention claimed is:

1. A method for the production of a wall lead-through for a plurality of cables, comprising the following steps:
   providing a wall with a wall breakthrough;
   arranging a housing of a wall lead-through on one side of the wall in such a way that a housing breakthrough formed on the housing is located opposite to the wall breakthrough,
   arranging at least one grid component within a holding space of the housing, wherein the at least one grid component is inserted, after the arranging the housing on the wall, from an opposite side of the wall through the wall breakthrough into the holding space and, there, into the area of the housing breakthrough, and provides therein separated receiving means, for one or a plurality of sealing elements each; and
   arranging a plurality of sealing elements in the separated receiving means, wherein a plurality of cables are provided that each run through the wall breakthrough and the housing breakthrough as well as an assigned sealing element, which is arranged around the respective cable in a sealing manner in the assigned receiving means.

2. The method according to claim 1, characterized in that exactly one sealing element is arranged in at least one part of the separated receiving means.

3. The method according to claim 1, characterized in that a plurality of sealing elements are arranged in at least one part of the separated receiving means.

4. The method according to claim 1, characterized in that the sealing elements automatically clamp the cable and encompass it in a sealing manner when inserted into the receiving means.

5. The method according to claim 4, characterized in that the automatic clamping and sealing effect increases the further the sealing element is inserted into the receiving means.

6. The method according to claim 1, characterized in that the sealing elements are detachably accommodated into the receiving means.

7. The method according to claim 1, characterized in that conically shaped sealing elements and/or conically shaped receiving means are employed.

8. The method according to claim 1, characterized in that an outer surface of the sealing elements and/or an inner surface of the receiving means has a surface structuring.

9. The method according to claim 1, characterized in that the sealing elements comprise an edge sealing lip arranged on a proximal and/or a distal front surface that is arranged at least in sections on a front surface of the grid component.

10. The method according to claim 1, characterized in that the front surface of the grid component is exposed at least in sections.

11. The method according to claim 1, characterized in that the grid component is detachably arranged within the housing.

12. The method according to claim 1, characterized in that an edge encompassing the housing breakthrough lies on the front surface of sealing elements adjacent to the edge at least in sections.

13. The method according to claim 1, characterized in that the grid element is designed as a single piece.

14. The method according to claim 1, characterized in that a cover is arranged on the opposite side of the wall.

15. An arrangement with a wall lead-through for a plurality of cables, produced according to the method according to claim 1 with
a wall with a wall breakthrough;
a housing of a wall lead-through which is arranged on one side of the wall in such a way that a housing breakthrough formed on the housing is located opposite to the wall breakthrough; and
a plurality of cables that each run through the wall breakthrough and the housing breakthrough as well as a an assigned sealing element which is arranged around the respective cable in a sealing manner within a holding space of the housing,
wherein, in the holding space of the housing, with the help of at least one grid component inserted, after the arranging of the housing on the wall, from an opposite side of the wall through the wall breakthrough into the holding space and, there, into the area of the housing breakthrough, separated receiving means are provided for one or a plurality of sealing elements each, in which the sealing elements are arranged.

* * * * *